US008852460B2

(12) United States Patent
Letessier et al.

(10) Patent No.: US 8,852,460 B2
(45) Date of Patent: Oct. 7, 2014

(54) ALKALI EARTH METAL PRECURSORS FOR DEPOSITING CALCIUM AND STRONTIUM CONTAINING FILMS

(75) Inventors: Olivier Letessier, San Jose, CA (US); Christian Dussarrat, Wilmington, DE (US); Benjamin J. Feist, Wilmington, DE (US); Vincent M. Omarjee, Bear, DE (US)

(73) Assignees: Air Liquide Electronics U.S. LP, Dallas, TX (US); American Air Liquide, Inc., Fremont, CA (US)

( * ) Notice: Subject to any disclaimer, the term of this patent is extended or adjusted under 35 U.S.C. 154(b) by 1129 days.

(21) Appl. No.: 12/406,682

(22) Filed: Mar. 18, 2009

(65) Prior Publication Data

US 2009/0236568 A1 Sep. 24, 2009

Related U.S. Application Data

(60) Provisional application No. 61/037,961, filed on Mar. 19, 2008.

(51) Int. Cl.
| | |
|---|---|
| *H01B 1/00* | (2006.01) |
| *H01B 1/12* | (2006.01) |
| *B05D 5/12* | (2006.01) |
| *C23C 16/00* | (2006.01) |
| *C23C 16/40* | (2006.01) |
| *B05D 3/12* | (2006.01) |
| *B05D 3/00* | (2006.01) |
| *H05H 1/24* | (2006.01) |
| *H01T 14/00* | (2006.01) |
| *H05B 6/02* | (2006.01) |
| *H05B 6/24* | (2006.01) |
| *C07F 5/00* | (2006.01) |
| *C08B 5/04* | (2006.01) |
| *H01L 39/24* | (2006.01) |
| *C04B 35/45* | (2006.01) |
| *C21B 13/00* | (2006.01) |
| *C21B 11/10* | (2006.01) |
| *C23C 16/455* | (2006.01) |

(52) U.S. Cl.
CPC ......... *C23C 16/404* (2013.01); *C23C 16/45553* (2013.01); *C23C 16/409* (2013.01)
USPC .............. 252/500; 427/79; 427/81; 427/123; 427/126.3; 427/248.1; 427/255.19; 427/255.28; 427/350; 427/398.4; 427/569; 427/580; 427/591; 75/10.1; 75/10.19; 75/300; 118/715; 118/724; 505/100; 505/120; 534/15; 556/40; 556/136

(58) Field of Classification Search
USPC .............. 427/255.28, 569, 248.1, 350, 398.4, 427/255.19, 580, 591, 79, 81, 123, 126.3; 75/300, 10.1, 10.19; 257/300, E21.011; 118/715, 724; 438/396, 571, 575, 3, 438/652, 745, 218, 484, 99, 253; 505/100, 505/120; 534/15; 546/2; 556/40, 136; 252/500
See application file for complete search history.

(56) References Cited

U.S. PATENT DOCUMENTS

| | | | |
|---|---|---|---|
| 5,496,582 A | 3/1996 | Mizutani et al. | |
| 7,316,962 B2 | 1/2008 | Govindarajan | |
| 2003/0073294 A1 | 4/2003 | Marsh | |
| 2006/0088660 A1* | 4/2006 | Putkonen et al. | 427/248.1 |
| 2006/0275545 A1* | 12/2006 | Yoshinaka et al. | 427/248.1 |

FOREIGN PATENT DOCUMENTS

| | | |
|---|---|---|
| EP | 1 717 343 | 11/2006 |
| WO | WO 00 15865 | 3/2000 |
| WO | WO 2004 046417 | 6/2004 |
| WO | WO 2008 088563 | 7/2008 |

OTHER PUBLICATIONS

Kukli et al. (Thin Solid Films vol. 500 2006, pp. 322-329).*
Frohlich, K. et al. "Preparation of SrRuO₃ films for advanced CMOS metal gates". Material Science in Semiconductor Processing 7 (2004) pp. 265-269.
Hatanpää, T. et al. "Synthesis and characterisation of cyclopentadienyl complexes of barium: Precursors for atomic layer deposition of BaTiO₃." Dalton Transactions, Mar. 8, 2004, pp. 1181-1188.
Kang, J. et al. "Metal-organic CVD of a (Ba,Sr)RuO₃ oxide electrode using a single cocktail source." Chemical Vapor Deposition, vol. 11, No. 1, Jan. 1, 2005, pp. 17-20.
Shibutani, T. et al. "A novel ruthenium precursor for MOCVD without seed ruthenium layer". Tosch R&D Review, 47, 2003.
Shibuya, K. et al. "Domain structure of epitaxial CaHfO₃ gate insulator films on SrTiO₃", Appi. Phys, Let. 84 (2004) 2142-2144.
Shibuya, K. et al. "Growth and structure of wide-gap insulator films on SrTiO₃", Solid State Electron., 47 (2003) 2211-2214.
Vehkamaki, M. et al. "Atomic Layer Deposition of BaTiO₃ thin films—Effect of barium hydroxide formation." Chemical Vapor Deposition, vol. 13, No. 5, May 1, 2007, pp. 239-246.

(Continued)

*Primary Examiner* — Patrick Ryan
*Assistant Examiner* — Aaron Greso
(74) *Attorney, Agent, or Firm* — Patricia E. McQueeney

(57) ABSTRACT

Methods and compositions for the deposition of a film on a substrate. In general, the disclosed compositions and methods utilize a precursor containing calcium or strontium.

9 Claims, No Drawings

(56) References Cited

OTHER PUBLICATIONS

IPRP and Written Opinion for related PCT/IB2009/051153, dated Sep. 21, 2010.
Studebaker, D. et al. "Low field, room temperature magnetoresistance in $(La_{y-x}M_x)_y$ $MnO_{3-\delta}$ (M=Ca, Sr) thin-films deposited by liquid delivery CVD". Materials Science and Engineering B56 (1998) pp. 168-172.

International Search Report and Written Opinion for PCT/IB2009/051153.
Kukli, K. et al. "Atomic layer deposition of calcium oxide and calcium hafnium oxide films using calcium cyclopentadienyl precursor", Thin Solid Films, Elsevier-Sequoia S.A., Lausanne, CH, vol. 500, No. 1-2, Apr. 3, 2006, pp. 322-329.
Burkey, D.J. et al. "Encapsulated alkaline-earth metallocenes. 2. Triisopropylcyclopentadienyl systems . . . " Organometallics, ACS, Washington, DC, US, vol. 12, No. 4, Jan. 1, 1993, pp. 1331-1337.

* cited by examiner

ALKALI EARTH METAL PRECURSORS FOR DEPOSITING CALCIUM AND STRONTIUM CONTAINING FILMS

CROSS REFERENCE TO RELATED APPLICATIONS

The present application claims the benefit of U.S. Provisional Application Ser. No. 61/037,961, filed Mar. 19, 2008, herein incorporated by reference in its entirety for all purposes.

BACKGROUND

1. Field of the Invention

This invention relates generally to compositions, methods and apparatus for use in the manufacture of semiconductor, photovoltaic, LCD-TFT, or flat panel type devices. More specifically, the invention relates to methods and compositions for depositing alkali earth metal thin films, with superconductive or magnetoresistance properties, on a substrate.

2. Background of the Invention

As the design and manufacturing of semiconductor devices continues to evolve, the semiconductor industry is constantly seeking new and novel methods of depositing films onto substrates, such that the resulting film will have certain sought after properties. Two such examples of sought after properties are films which exhibit superconductive-like or magnetoresistance properties. Field effect transistors (FET) with a semiconductor channel make use of an oxide superconductor material in the gate electrode, which can provide control of parasitic resistance, capacitance, and a proper work function when operated at an adequate temperature. Magnetoresistance materials are used in hard drive applications, and allow for better density and capacity of storage in the resultant devices.

Films utilizing calcium and strontium, especially such films with a perovskite-type structure, have been examined for these superconductive and magnetoresistance applications. Some of the structures which have shown promise for these applications include: $CaCu_3Ti_4O_{12}$; $CaTiO_3$; (PrCa)$MnO_3$; (Ca, Mn,Sr)$RuO_3$; $ZrO_2$—CaO—$ZrO_2$; $HfO_2$—CaO—$HfO_2$; Ca:$ZrO_2$; Ca:$HfO_2$; Ca:$Ln_2O_3$.

In the case of calcium/hafnium structures, because of its ability to form solid solutions and ternary crystalline phases, calcium oxide is an appropriate additive to $HfO_2$. Stoichiometric compounds with low defects should form relatively easily, compared to mixtures of $Al_2O_3$ and $HfO_2$. CaO has a wide band gap (6.8 eV), which might be suitable in dielectric stacks with HfO2 for instance.

With its perovskite structure, $CaHfO_3$ has been considered as an interesting material for gate capacitor dielectric in metal-oxide-semiconductor field-effect-transistor (MOSFET) with Si or $SrTiO_3$ channels.

Calcium oxide films have been obtained by atomic layer deposition (ALD) process using calcium β-diketonate, $O_2$ and ozone. The material first formed was calcium carbonate which turned into CaO after heat treatment at 670° C. in $CO_2$-free atmosphere.

Consequently, there exists a need for methods and materials to deposit thing films containing calcium and strontium.

BRIEF SUMMARY

Embodiments of the present invention provide novel methods and compositions for the deposition of a film on a substrate. In general, the disclosed compositions and methods utilize a precursor containing calcium or strontium.

In an embodiment, a method for depositing an alkali earth metal containing film on one or more substrates comprises providing at least one substrate disposed in a reactor. A vapor form precursor is introduced into the reactor. The precursor has the general formula:

$$M(R_xCp)_2$$

wherein M is calcium or strontium, each R is independently either H or a C1-C6 linear, branched, or cyclic alkyl group, and $0 \le x \le 5$. At least part of the precursor is deposited on one or more of the substrates to form a film which has superconductor-like or magnetoresistance properties.

Other embodiments of the current invention may include, without limitation, one or more of the following features:
- the first precursor is one of $Ca(iPr_3Cp)_2$; $Ca(Me_5Cp)_2$; $Ca(EtCp)_2$; $Ca(tBu_3Cp)_2$; $Sr(iPr_3Cp)_2$; $Sr(Me_5Cp)_2$; $Sr(tBu_3Cp)_2$; and $Sr(EtCp)_2$;
- the first precursor has at least two anionic ligands to the calcium or strontium;
- the first precursor is adducted with at least one of: dimethoxyethane (DME), tetrahydrofuran (THF); diethylether; acetonitrile; triglyme; tetraglyme; triene; and tetraene;
- the first precursor is initially supplied blended with at least one of: toluene; benzene; pentane; hexane; cyclohexane; heptane; tetrahydrofuran; chloroform; dichloromethane; ethyl acetate; acetonitrile; dimethylformamide; ethanol; methanol; propanol; isopropanol; butanol; mesitylene; butylacetate; xylene; and octane;
- a second precursor is introduced into the reactor, and the second precursor contains at least one metal selected from: Cu; Pr; Mn; Ru; Zr; Hf; and Ln;
- an oxygen containing reactant is introduced into the reactor, wherein the reactant is selected from: ozone; oxygen; water; nitric oxide; and a carboxylic acid;
- the deposition process for depositing the film is either a chemical vapor deposition (CVD) or atomic layer deposition (ALD) type process, and either may type be a plasma enhanced process;
- the deposition process is performed at temperature between about 100° C. and about 600° C.;
- the deposition process is performed at a pressure between about 0.1 mTorr and about 100 Torr; and
- the deposited film is a (Pr,Ca)$MnO_3$ type film.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

Notation and Nomenclature

Certain terms are used throughout the following description and claims to refer to various components and constituents. This document does not intend to distinguish between components that differ in name but not function.

As used herein, the term "alkyl group" refers to saturated functional groups containing exclusively carbon and hydrogen atoms. Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation, "Me," refers to a methyl group; the abbreviation, "Et," refers to an ethyl group; the abbreviation, "t-Bu," refers to a tertiary butyl group, the abbreviation, "Cp", refers to a cyclopentadienyl group; and the abbreviation "iPr$_3$Cp" refers to 1,2,4-tri-isopropylcyclopentadienyl.

As used herein, the term "superconductor" when applied properties or materials refers to properties or materials which exhibit little to no electrical resistivity, and which when in bulk, exhibit no magnetic field.

As used herein, the term "magnetoresistant or magnetoresistance" when applied to properties or materials refers to the changing of the electrical resistance of a material when an external magnetic field is applied.

As used herein, the term "independently" when used in the context of describing R groups should be understood to denote that the subject R group is not only independently selected relative to other R groups bearing different superscripts, but is also independently selected relative to any additional species of that same R group. For example, in the formula $MR^1{}_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

DESCRIPTION OF PREFERRED EMBODIMENTS

Embodiments of the present invention provide novel methods and compositions for the deposition of a film on a substrate. In general, the disclosed compositions and methods utilize a precursor containing calcium or strontium.

In an embodiment, a method for depositing an alkali earth metal containing film on one or more substrates comprises providing at least one substrate disposed in a reactor. A vapor form precursor is introduced into the reactor. The precursor has the general formula:

$$M(R_xCp)_2$$

wherein M is calcium or strontium, each R is independently either H or a C1-C6 linear, branched, or cyclic alkyl group, and $0 \leq x \leq 5$. At least part of the precursor is deposited on one or more of the substrates to form a film which has superconductor-like or magnetoresistance properties.

The disclosed precursors may be deposited to form a thin film using any deposition methods known to those of skill in the art. Examples of suitable deposition methods include without limitation, conventional CVD, low pressure chemical vapor deposition (LPCVD), plasma enhanced chemical vapor depositions (PECVD), atomic layer deposition (ALD), pulsed chemical vapor deposition (P-CVD), plasma enhanced atomic layer deposition (PE-ALD), or combinations thereof.

In an embodiment, a precursor in vapor form is introduced into a reactor. The precursor in vapor form may be produced by vaporizing a liquid precursor solution, through a conventional vaporization step such as direct vaporization, distillation, or by bubbling an inert gas (e.g. N$_2$, He, Ar, etc.) into the precursor solution and providing the inert gas plus precursor mixture as a precursor vapor solution to the reactor. Bubbling with an inert gas may also remove any dissolved oxygen present in the precursor solution.

The reactor may be any enclosure or chamber within a device in which deposition methods take place such as without limitation, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates on to which the thin films will be deposited. The one or more substrates may be any suitable substrate used in semiconductor, photovoltaic, flat panel or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium or gold) may be used. The substrate may also have one or more layers of differing materials already deposited upon it.

In some embodiments, in addition to the precursor vapor solution, a reactant gas may also be introduced into the reactor. The reactant gas may be one of oxygen, ozone, water, hydrogen peroxide, nitric oxide, nitrogen dioxide, radical species of these, as well as mixtures of any two or more of these.

In some embodiments, and depending on what type of film is desired to be deposited, a second precursor gas may be introduced into the reactor. The second precursor gas comprises another metal source, such as copper, praseodymium, manganese, ruthenium, zirconium, hafnium, or lanthanum.

The first precursor and any optional reactants or precursors may be introduced sequentially (as in ALD) or simultaneously (as in CVD) into the reaction chamber. In some embodiments, the reaction chamber is purged with an inert gas between the introduction of the precursor and the introduction of the reactant. In one embodiment, the reactant and the precursor may be mixed together to form a reactant/precursor mixture, and then introduced to the reactor in mixture form. In some embodiments, the reactant may be treated by a plasma, in order to decompose the reactant into its radical form. In some of these embodiments, the plasma may generally be at a location removed from the reaction chamber, for instance, in a remotely located plasma system. In other embodiments, the plasma may be generated or present within the reactor itself. One of skill in the art would generally recognize methods and apparatus suitable for such plasma treatment.

In some embodiments, the temperature and the pressure within the reactor are held at conditions suitable for ALD or CVD depositions. For instance, the pressure in the reactor may be held between about 0.0001 and 1000 torr, or preferably between about 0.1 and 10 torr, as required per the deposition parameters. Likewise, the temperature in the reactor may be held between about 50° C. and about 600° C., preferably between about 200° C. and about 500° C.

In some embodiments, the precursor vapor solution and the reaction gas, may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reaction gas, may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

In an embodiment, the precursor may be $Ca(iPr_3Cp)_2$, which in comparison to other precursors such as $Ca(tmhd)_2$, exhibits good volatility properties. $Ca(iPr_3Cp)_2$ may be used with $Pr(tmhd)_3$, $Mn(tmhd)_2$, and an oxygen containing reactant to deposit a $(Pr,Ca)MnO_3$ film.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of depositing an alkali earth metal containing film on one or more substrates, comprising:
    a) providing at least one substrate disposed in a reactor;
    b) introducing a first precursor in vapor form into the reactor, wherein the first precursor is $Ca(iPr_3Cp)_2$
    c) introducing a second precursor gas into the reactor, wherein the second precursor is $Pr(tmhd)3$;
    d) introducing $Mn(tmhd)2$ into the reactor; and
    e) depositing at least part of the first precursor to form an alkali earth metal containing film on the one or more substrates, wherein the alkali earth metal film comprises a $(PrCa)MnO_3$ film.

2. The method of claim 1, wherein the first precursor is adducted with at least one member selected from the group consisting of: dimethoxyethane; diethylether; acetonitrile; tetrahydrofuran; triglyme; tetraglyme; triene; and tetraene.

3. The method of claim 1, wherein the first precursor is initially supplied in a blended form with at least one solvent selected from the group consisting of: toluene; benzene; pentane; hexane; cyclohexane; heptane; tetrahydrofuran; chloroform; dichloromethane; ethyl acetate; acetonitrile; dimethylformamide; ethanol; methanol; propanol; isopropanol; butanol; mesitylene; butylacetate; xylene; and octane.

4. The method of claim 1, further comprising introducing at least one oxygen containing reactant into the reactor, wherein the oxygen containing reactant comprises at least one member selected from the group consisting of: ozone; oxygen; water; nitric oxide; and carboxylic acid.

5. The method of claim 1, further comprising depositing the alkali earth metal containing film through a chemical vapor deposition (CVD) process or an atomic layer deposition (ALD) process.

6. The method of claim 5, further comprising depositing the alkali earth metal containing film through a plasma enhanced chemical vapor deposition (PECVD) process or a plasma enhanced atomic layer deposition (PEALD) process.

7. The method of claim 5, wherein the deposition process is performed at a temperature between about 100° C. and about 600° C.

8. The method of claim 5, wherein the deposition is performed at a pressure between about 0.1 mTorr and about 100 Torr.

9. The method of claim 1, wherein the alkali earth metal film deposited on the substrate exhibits superconductor-like or magnetoresistance properties.

* * * * *